US008514017B2

(12) United States Patent
Araki

(10) Patent No.: US 8,514,017 B2
(45) Date of Patent: Aug. 20, 2013

(54) VARIABLE GAIN AMPLIFIER AND AUDIO DEVICE

(75) Inventor: Ryuichi Araki, Kyoto (JP)

(73) Assignee: Ricoh Company, Ltd., Tokyo (JP)

( * ) Notice: Subject to any disclaimer, the term of this patent is extended or adjusted under 35 U.S.C. 154(b) by 2 days.

(21) Appl. No.: 13/291,172

(22) Filed: Nov. 8, 2011

(65) Prior Publication Data
US 2012/0119828 A1    May 17, 2012

(30) Foreign Application Priority Data

Nov. 16, 2010 (JP) ................................. 2010-255449

(51) Int. Cl.
*H03G 3/20* (2006.01)
(52) U.S. Cl.
USPC ............................................. 330/144; 330/86
(58) Field of Classification Search
USPC .................................... 330/86, 144, 282, 284
See application file for complete search history.

(56) References Cited

U.S. PATENT DOCUMENTS 5,077,541 A * 12/1991 Gilbert ........................... 330/284
2009/0102550 A1* 4/2009 Ohama et al. ................... 330/10

FOREIGN PATENT DOCUMENTS

| JP | 6-291573 | 10/1994 |
| JP | 9-93064 | 4/1997 |
| JP | 2008-109560 | 5/2008 |
| JP | 2010-21775 | 1/2010 |

* cited by examiner

*Primary Examiner* — Steven J Mottola
(74) *Attorney, Agent, or Firm* — Cooper & Dunham LLP

(57) ABSTRACT

A variable gain amplifier, to amplify an audio input signal to output an audio output signal at an adjustable gain, includes an operational amplifier having an inverting input terminal, a non-inverting input terminal, and an output terminal to output the audio output signal; an attenuation-rate adjustable feedback circuit to feed back the audio output signal from the output terminal of the operational amplifier to the inverting input terminal of the operational amplifier as a feedback signal, and attenuate the audio output signal and output the feedback signal to the inverting terminal; and an attenuation-rate adjustable attenuator to attenuate the audio input signal for output it as an attenuated signal to the non-inverting input terminal of the operational amplifier. Settings of the attenuation rates of the feedback circuit and the attenuator are combined and a resolution of level of the audio output signal is increased.

9 Claims, 7 Drawing Sheets (COMPARATIVE EXAMPLE)

(COMPARATIVE EXAMPLE)

(COMPARATIVE EXAMPLE)

$$\alpha = \frac{V2}{V1} = \frac{R1}{R1 + R2}$$

(COMPARATIVE EXAMPLE)

$$A_v = \frac{V_o}{V_i} = 1 - \frac{1}{\alpha}$$

$$Av = \frac{Vo}{Vi} = 1 - \frac{1}{\alpha} + \frac{\beta}{\alpha}$$

VARIABLE GAIN AMPLIFIER AND AUDIO DEVICE

CROSS-REFERENCE TO RELATED APPLICATIONS

This patent application is based on and claims priority pursuant to 35 U.S.C. §119 to Japanese Patent Application No. 2010-255449, filed on Nov. 16, 2010, in the Japan Patent Office, the entire disclosure of which is hereby incorporated by reference herein.

BACKGROUND

1. Technical Field

The present disclosure relates to a variable gain amplifier that varies signal feedback to an operational amplifier to control amplification of an output signal and an audio device incorporating the variable gain amplifier, and more particularly to a variable gain amplifier, incorporated in an audio device, to effectively reduce a popping noise when the gain is changed, and an audio device incorporating the variable gain amplifier.

2. Description of the Background Art

Amplifiers (variable gain amplifiers) that can vary gain to control and adjust volume level of audio signals are widely used in audio devices having a radio receiving function and a playback function to play back compact disks (CD) or mini disks (MD).

The variable gain amplifiers generally use operational amplifiers and feedback circuits, with the feedback circuit used to feed back an output signal output from an output terminal of the operational amplifier to an inverting input terminal of the operational amplifier and change the amount of feedback, which allows the variable gain amplifiers to vary their gain. Circuits for audio devices in which variable gain is used for control of sound amplification are proposed in JP-H09-093064-A and JP-H06-291573-A.

In a known variable gain amplifier, an attenuator to attenuate the signal to a suitable signal level is used as the feedback circuit, with resistance-dividing ratio in the feedback circuit changed by a digital control signal from, for example, a microcomputer.

FIG. 1 is a block diagram illustrating a configuration of a conventional variable gain amplifier 60. As illustrated in FIG. 1, the variable gain amplifier 60 includes an operational amplifier (OP) 61 and a feedback circuit (FB) 62 connected to the operational amplifier 61.

The feedback circuit 62 includes resistors and switching circuitry including multiple switches. The feedback circuit 62 adjusts an amount of voltage to be fed back to an inverting input terminal (−) of the operational amplifier 61 by opening and closing the switches in accordance with a control signal from a level control circuit to change a resistance-dividing ratio in the feedback circuit 62.

However, in this configuration, since the gain varies in steps, a noise called "popping" caused by rapid fluctuation in signal level of audio signal may be generated when the gain varies.

In order to prevent generation of the popping noise when the gain varies, improving resolution of gain settings and reducing the rapid fluctuation in the signal level are required.

As for a technique of improving the resolution of gain settings, it is easily conceivable that the number of resistors and switches is simply increased. However, in this technique, the size of circuit is increased, which is impractical.

Alternatively, as illustrated in FIG. 2, a configuration in which two variable gain amplifiers are provided and both are connected in series is known.

However, in the circuit shown in FIG. 2, two operational amplifiers are required in the two variable gain amplifiers 101 and 102 and an output noise level of the audio signal is increased by connecting the two operational amplifiers in series.

As illustrated in FIG. 3, a configuration in which the feedback circuit 62 is constituted by a D-A multiplier using R-2R digital-analog converter (DAC) consisting of a ladder network of resistors with only two values is proposed as yet another known technique.

However, in the D-A multiplier circuit including the R-2R DAC shown in FIG. 3, due to the nature of the circuit, on resistances of the switches in the switching circuit may causes a distortion rate of the audio signal to degrade. That is, when the R-2R DAC of the D-A multiplier in a variable gain amplifier is used in an audio playback device, since resistances of the resistors in the R-2R DAC cannot be made very large, it is difficult to obtain the switches whose on resistances are sufficiently small with respect to the resistors in the R-2R DAC, thereby inevitably causing the distortion rate to deteriorate.

In addition, differing from the configuration in which the variable gain amplifier that varies the feedback amount of the output signal of the operational amplifier fed back to the inverting input terminal thereof, a sound signal processor is proposed in JP-2008-109560-A to prevent generation of the popping noise. The sound signal processor handles soft mute to alleviate the noise generated when the mode is changed and a power supply is on or off. In this sound signal processor, a mute time is set to a time around half the wavelength of a minimum frequency in a playback band, which prevents generation of the popping noise when the mute is on or off.

In addition, an audio circuit that feeds back an output signal of the operational amplifier to the inverting input terminal thereof and does not vary the feedback amount is proposed in JP-2010-021175-A. In this configuration, the audio circuit outputs a first reference voltage to be input to the non-inverting input terminal of the operational amplifier that is raised in a state in which the voltage is half a normal voltage and the waveform is symmetrical above and below the normal voltage when the power is on, and when the power is off outputs a second reference voltage whose voltage is symmetrical to the voltage while the power is on. Therefore, an unnecessary high-frequency wave component is reduced, which alleviates the popping noise. However, in this configuration, complicated circuitry is required for generating the reference voltages.

SUMMARY

In one aspect of this disclosure, there is a provided a variable gain amplifier to adjust gain and level of an output voltage, including an input terminal from which an input voltage is input, an output terminal to which the output voltage is output, an operational amplifier, and an attenuation-rate adjustable feedback circuit. The operational amplifier is connected to the output terminal and has an inverting input terminal, a non-inverting input terminal, and an output terminal to output the output voltage. The attenuation-rate adjustable feedback circuit is connected to the input terminal, the inverting terminal, and the output terminal of the operational amplifier. The attenuation-rate adjustable feedback circuit feeds back the output voltage from the output terminal of the operational amplifier to the inverting input terminal of the operational amplifier as a feedback voltage, attenuates the output voltage, and outputs the feedback voltage to the inverting terminal of the operational amplifier. The attenuation-rate adjustable attenuator is connected to the input terminal and the non-inverting terminal of the operational amplifier. The attenuation-rate adjustable attenuator attenuates the input voltage for output it as an attenuated voltage to the non-inverting input terminal of the operational amplifier. Settings of the attenuation rates of the feedback circuit and the attenuator are combined and a resolution of level of the output voltage is increased.

In another aspect of this disclosure, there is a provided a variable gain amplifier to adjust gain and level of an audio output signal, including an input terminal from which an audio input signal is input, an output terminal to which the audio output signal is output, an operational amplifier, and an attenuation-rate adjustable feedback circuit. The operational amplifier is connected to the output terminal and has an inverting input terminal, a non-inverting input terminal, and an output terminal to output the audio output signal. The attenuation-rate adjustable feedback circuit is connected to the input terminal, the inverting terminal, and the output terminal of the operational amplifier. The attenuation-rate adjustable feedback circuit feeds back the audio output signal from the output terminal of the operational amplifier to the inverting input terminal of the operational amplifier as a feedback signal, attenuates the audio output signal, and outputs the feedback signal to the inverting terminal of the operational amplifier. The attenuation-rate adjustable attenuator is connected to the input terminal and the non-inverting terminal of the operational amplifier. The attenuation-rate adjustable attenuator attenuates the audio input signal for output it as an attenuated signal to the non-inverting input terminal of the operational amplifier. Settings of the attenuation rates of the feedback circuit and the attenuator are combined and a resolution of level of the audio output signal is increased.

In another aspect of this disclosure, there is a provided an audio device including a digital signal processor to do digital signal processing and the above-described variable gain amplifier to adjust gain and level of an audio output signal

BRIEF DESCRIPTION OF THE DRAWINGS

The aforementioned and other aspects, features and advantages would be better understood by reference to the following detailed description when considered in connection with the accompanying drawings, wherein.

DETAILED DESCRIPTION OF PREFERRED EMBODIMENTS

Figure 1:
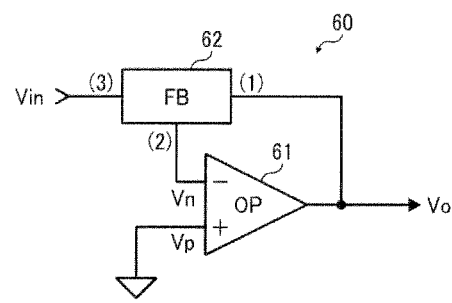
FIG. 1 is a block diagram illustrating a configuration of a conventional variable gain amplifier.
Figure 2:
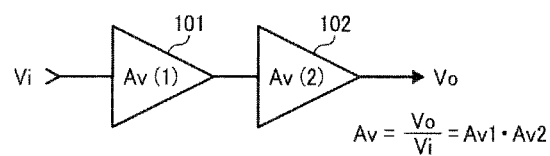
FIG. 2 is a block diagram illustrating a configuration of a conventional variable gain amplifier.
Figure 3:
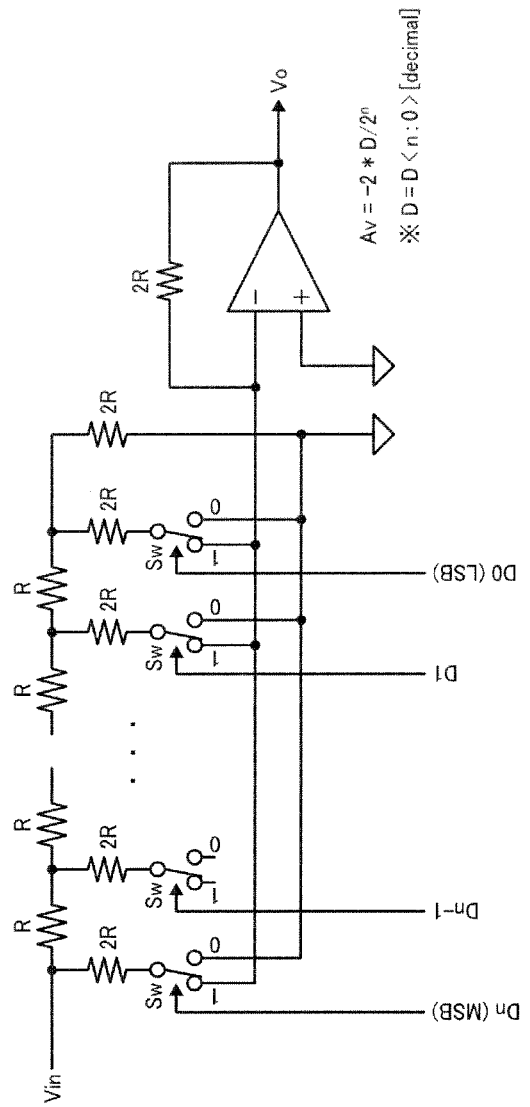
FIG. 3 is a block diagram illustrating a configuration of a conventional variable gain amplifier.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result. Referring now to the drawings, wherein like reference numerals designate identical or corresponding parts throughout the several views, particularly to FIGS. 4 and 9 through 11, a variable gain amplifier according to illustrative embodiments is described.

Figure 4:
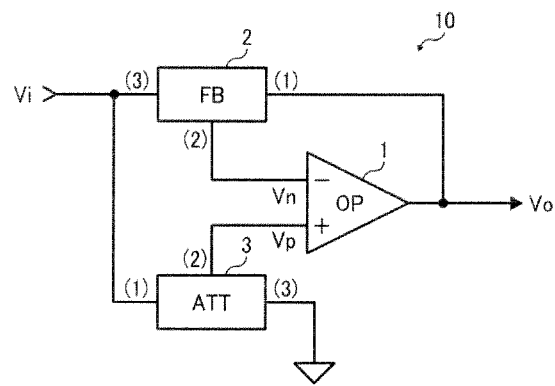
FIG. 4 is a block diagram illustrating a variable gain amplifier according to a embodiment of the present disclosure.

FIG. 4 is a block diagram illustrating a variable gain amplifier 10 according to a first embodiment. In FIG. 4, the variable gain amplifier 10 includes an operational amplifier 1, a feedback circuit 2, and an attenuator 3.

In a state in which the variable gain amplifier 10 is installed in an audio device, when level of an audio signal is adjusted, the variable gain amplifier 10 continuously varies its output level, by using respective adders-substrators in the feedback circuit 2 and the attenuator 3, and changing settings of attenuation rates at both inverting input terminal (−) and non-inverting input terminal (+) of the operational amplifier 1.

Figure 5:
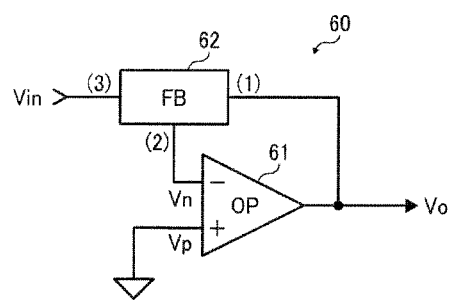
FIG. 5 is a block diagram illustrating a variable amplifier according to a comparative example.
Figure 6:
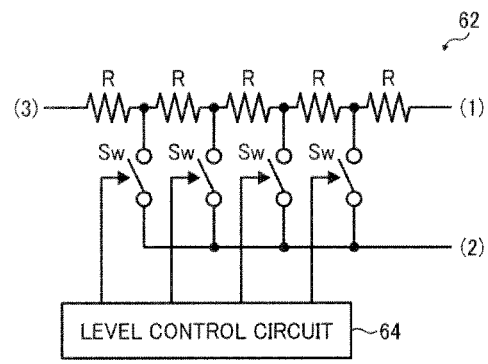
FIG. 6 is a block diagram illustrating a feedback circuit in the variable gain amplifier of the comparative example shown in FIG. 5.
Figure 7:
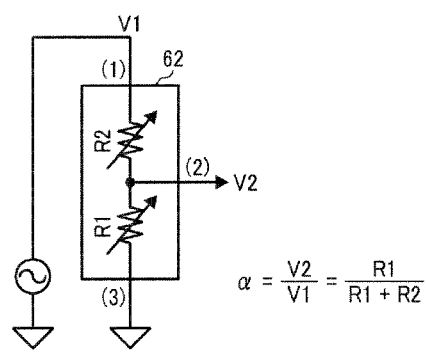
FIG. 7 is a diagram illustrating an input-output gain of the feedback circuit of the comparative example shown in FIG. 6.
Figure 8:
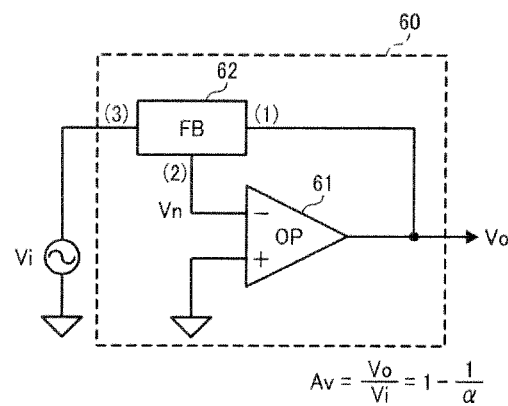
FIG. 8 is a diagram illustrating an input-output gain of the variable gain amplifier of the comparative example shown in FIG. 5.

Before proceeding with the description of the operation of the present embodiment, the operation as a comparative example of a variable gain amplifier 60 in which the attenuator 3 is not provided is described below. FIG. 5 is a block diagram illustrating the variable gain amplifier 60 according to the comparative example. The variable gain amplifier 60 includes an operational amplifier 61 and a feedback circuit 62. FIG. 6 is a block diagram illustrating the feedback circuit 62 in the variable gain amplifier 60. FIG. 7 is a diagram illustrating an input-output gain of the feedback circuit 62 shown in FIG. 6. FIG. 8 is a diagram illustrating an input-output gain of the variable gain amplifier shown in FIG. 5.

As illustrated in FIG. 6, the feedback circuit 62 includes resistors R and a switching circuit including multiple switches Sw. The feedback circuit 62 adjusts an amount of voltage to be fed back to an inverting input terminal (−) of the operational amplifier 61 by opening and closing the switches Sw in accordance with a control signal from a level control circuit 64 to change a resistance-dividing ratio.

Assuming that an open loop gain of the operational amplifier 61 is sufficiently high, a closed loop gain (Av) of the operational amplifier 61 (input-output gain of the variable gain amplifier 60) is determined by an attenuation rate α of the feedback circuit 62.

Representing an input voltage (audio input signal) as Vi, an output voltage (audio output signal) as Vo, and the attenuation rate of the feedback circuit 62 as α, a voltage Vn at the inverting input terminal (−) can be calculated using the following Formula 1-1.

$$Vn = \alpha \cdot (Vo - Vi) + Vi \qquad (1\text{-}1)$$

In addition, when a terminal (3) to which the audio input signal Vi is input is considered as a reference point as shown in FIG. 7, the attenuation rate α of the feedback circuit 62 is a ratio of a voltage V2 at a terminal (2) connected to the inverting input terminal (−) of the operational amplifier 61 to a voltage V1 at a terminal (1) connected to an output terminal of the operational amplifier 61, which is represented by the following relation.

$$\alpha = V2/V1 = R1/(R1+R2)$$

Assuming that the open loop gain of the operational amplifier 61 is sufficiently high, the voltage Vn at the inverting input terminal (−) and a voltage at a non-inverting input terminal (+) become identical voltages by imaginary short (virtual short). In this case, since the voltage at the non-inverting input terminal (+) becomes 0 V, the following Formula 1-2 holds.

$$\alpha \cdot (Vo - Vi) + Vi = 0 \qquad (1\text{-}2)$$

By rewriting the Formula 1-2, the closed loop gain Av of the operational amplifier 61 is calculated by the following Formula 1-3:

$$Av = Vo/Vi = 1 - 1/\alpha \qquad (1\text{-}3)$$

For example, when the attenuation rate α of the feedback circuit 62 is 0.5, the closed loop gain Av of the operational amplifier 61 becomes "−1" (Av=1−1/0.5), that is an inverting value.

Thus, in the operation of the variable gain amplifier 60 according to the comparative example, by changing the gain α of the feedback circuit 62, the output level of the variable gain amplifier 60 is changed. However, by using only the feedback circuit 62, since the gain in the variable gain amplifier 60 varies in step, a noise caused by rapid fluctuation in a signal level called "popping noise" is generated when the gain varies.

In order to prevent the generation of the popping noise when the gain varies, improving resolution of the gain settings and reducing the rapid fluctuation in the signal level are required. Therefore, in the present embodiment, the variable gain amplifier 10 shown in FIG. 4 further includes the attenuator 3 in addition to the operational amplifier 61 and the feedback circuit 62 in the variable gain amplifier 60 shown in FIG. 5. The configuration of the operational amplifier 1 and the feedback circuit 2 of the present embodiment is similar to the operational amplifier 61 and the feedback circuit 62 of the comparative example shown in FIG. 5.

A basic configuration of the attenuator 3 is an analog adder-subtractor circuit, similarly to the feedback circuit 2. An input voltage (audio input signal) Vi is input to a non-inverting input terminal (+) of the operational amplifier 1 via the attenuator 3.

Figure 9:
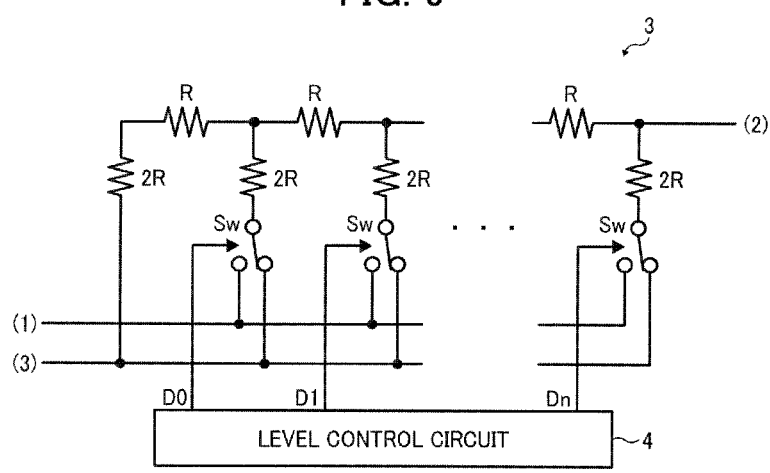
FIG. 9 is a block diagram illustrating an attenuator in the variable gain amplifier of the present disclosure shown in FIG. 4.

Herein, although the attenuator 3 can be implemented as a simple resistance divider circuit like the circuit of the feedback circuit 2, in the present embodiment an R-2R digital-analog converter (DAC) consisting of a ladder network of resistors with only two values is used for the attenuator 3 to easily improve the resolution of gain settings as shown in FIG. 9. FIG. 9 is a block diagram illustrating the attenuator 3 in the variable gain amplifier 10 of the present disclosure shown in FIG. 4.

That is, as illustrated in FIG. 9, the attenuator 3 includes resistors R and switching circuit including multiple switches Sw. The attenuator 3 adjusts an amount of voltage to be input to the non-inverting input terminal (+) of the operational amplifier 1 by opening and closing the switches Sw in accordance with a control signal from a level control circuit 4 to change a resistance-dividing ratio.

Figure 10:
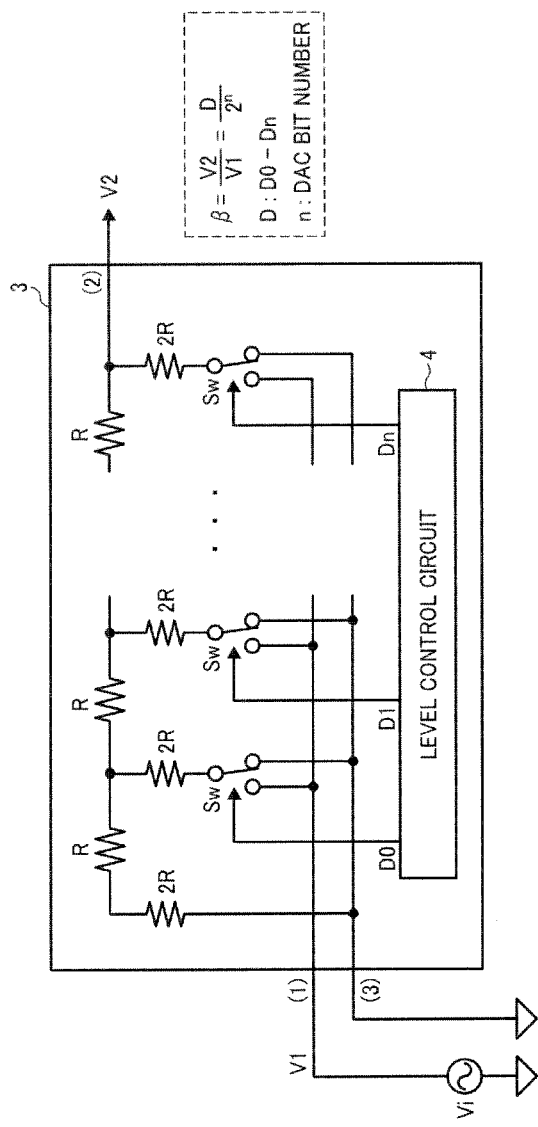
FIG. 10 is a diagram illustrating an input-output gain of the attenuator shown in FIG. 9.
Figure 11:
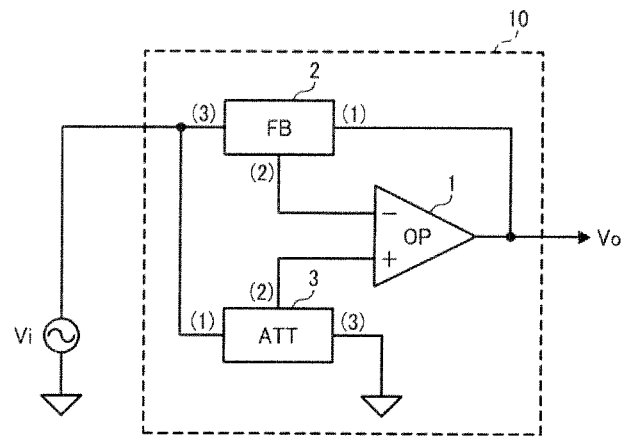
FIG. 11 is a diagram illustrating an input-output gain of the variable gain amplifier shown in FIG. 4.

FIG. 10 is a diagram illustrating an input-output gain of the attenuator 3 shown in FIG. 9. FIG. 11 is a diagram illustrating an input-output gain of the variable gain amplifier 10 shown in FIG. 4. Assuming that the open loop gain of the operational amplifier 1 is sufficiently high, the input voltage is represented by Vi, the output voltage is represented by Vo, and representing the attenuation rate of the feedback circuit 2 as a shown in FIG. 7 and the attenuation rate of the attenuator as β (β=V2/V1=D/$2^n$) as shown in FIG. 10, a closed loop gain (closed circuit gain) Av of the operational amplifier 1 can be calculated as follows.

Initially, a voltage (attenuated signal) Vp at the non-inverting input terminal (+) of the operational amplifier 1 is obtained by the following Formula 2-1.

$$Vp = \beta \times Vi \qquad (2\text{-}1)$$

By contrast, a voltage (feedback signal) Vn at the inverting input terminal (−) of the operational amplifier 1 is obtained by the following Formula 2-2.

$$Vn = \alpha \cdot (Vo - Vi) + Vi \qquad (2\text{-}2)$$

Assuming that the open loop gain of the operational amplifier 1 is sufficiently high, the voltage Vp and the voltage Vn become identical voltage by imaginary short (virtual short), and relation of the voltage values represented by the following Formula 2-3 holds based on the Formulas 2-1 and 2-2.

$$\beta \times Vi = \alpha \cdot (Vo - Vi) + Vi \qquad (2\text{-}3)$$

By rewriting the Formula 2-3, the closed loop gain (closed circuit gain) Av of the operational amplifier 1 is obtained by the following Formula 2-4:

$$Av = Vo/Vi = 1 - (1/\alpha) + (\beta/\alpha) \qquad (2\text{-}4)$$

As is clear from Formula 2-4, the closed circuit gain Av of the operational amplifier 1 can be controlled by a combination of the attenuation rate α of the feedback circuit 2 and the attenuation rate β of the attenuator 3.

Figure 12:
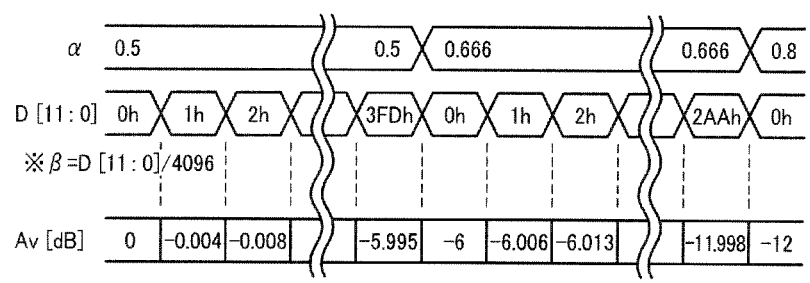
FIG. 12 is a timing chart of a control operation of the variable gain amplifier illustrating attenuation rates of the feedback circuit and the attenuator and a gain of the variable gain amplifier shown in FIG. 4.

Herein, control of gain variation (gain transition) in the variable gain amplifier 10 is described below with reference to FIG. 12. FIG. 12 is a timing chart of the attenuation rates of the feedback circuit 2 and the attenuator 3 and the gain Av of the variable gain amplifier 10. In FIG. 12, the gain Av of the variable gain amplifier 10 varies (transits) from 0 dB to −12 dB, steps in the gain of the attenuation rate α is 6 dB, and the attenuator 3 is constituted by a 12-bit DAC. As is clear from FIG. 12, by combining variation control of the attenuation rate β of the attenuator 3 with variation control of the attenuation rate α of the feedback circuit 2, the closed loop gain Av can transit from "0", "−0.004", "−0.008", . . . , "−53995", "−6", "−6.013", . . . , "−11.998", to "−12" at a higher resolution.

As the number of bits in the DAC used as the attenuator 3 is increased, the resolution of gain settings is improved, providing seamless gain transition. Therefore, generation of the popping noise can be prevented.

In addition, when the audio device including the variable gain amplifier 10 is in normal playback mode (gain is fixed), the attenuation rate β is 0, that is, the voltage Vp at the non-inverting input terminal (+) of the operational amplifier 1 is 0. That is, the attenuator 3 is activated only when the gain varies. With this operation, the variable gain amplifier 10 is equivalent to the circuit of the variable gain amplifier 60 according to the comparative example and degradation of the distortion rate caused by the R-2R DAC in a D-A multiplier (constituting attenuator 3) can be eliminated.

As described above with reference to FIGS. 4 and 9 through 12, the variable gain amplifier 10 amplifies the input voltage (audio input signal) Vi and outputs the output signal Vo, including the operational amplifier 1, the feedback circuit 2, and the attenuator 3. The operational amplifier 1 has the inverting input terminal (−), the non-inverting input terminal (+), and the output terminal. The feedback circuit 2 feeds back the output signal from the output terminal of the operational amplifier 1 to the inverting input terminal (−) of the operational amplifier 1 as the feedback signal Vn, attenuates the feedback signal Vn to vary a gain. The feedback circuit 2 is adjustable the attenuation rate α and level of the feedback voltage (feedback signal) Vn input to the inverting input terminal (−) of the operational amplifier 1. The attenuator 3 attenuates the audio input signal Vi in a whole circuit 10 for output to the non-inverting input terminal (+) of the operational amplifier 1 as the attenuated voltage (attenuated signal) Vp to vary the gain. The attenuator 3 is adjustable an attenuation rate β and level of the attenuated signal Vp input to the non-inverting input terminal (+) of the operational amplifier 1. In this configuration, settings of the attenuation rates of the attenuator 3 and the feedback circuit 2 are combined and a resolution of level settings of the output voltage (audio output signal) Vo is increased.

Moreover, as described above, an analog adder-subtractor circuit is used as an output adjustment device in the variable gain amplifier 10 to amplify the audio signal (audio input signal) Vi, and the circuits 2 and 3 that are adjustable the attenuation rates are provided for both input sides of the inverting input terminal (−) and the non-inverting input terminal (+) of the operational amplifier 1 in the variable gain amplifier 10. With this configuration, the resolution of level settings of the audio output signal is improved by combining the attenuation rates of the attenuator 3 and the feedback circuit 2. Therefore, it becomes possible to continuously change the sound volume and to prevent generation of the popping noise.

Further, the feedback circuit 2 is constituted by resistance dividing switching type analog adder-subtractor, the attenuator 3 is constituted by the DAC, and the respective attenuation rates of the feedback circuit 2 and the attenuator 3 are controlled by digital signals from the level control circuit 4. For example, the inverting input terminal (−) of the operational amplifier 1 is connected to the feedback circuit 2 (resistance voltage switching type) and the non-inverting input terminal (+) of the operational amplifier 1 is connected to the attenuator 3 (DAC), and the both voltages at the terminals are controlled by the digital signal from the level control circuit 4 formed of microcomputers.

In addition, the attenuator 3 is activated only when the gain varies, and the gain in the variable gain amplifier 10 is determined by only the feedback circuit 2 when the gain is fixed. More specifically, the attenuator 3 connected to the non-inverting input terminal (+) is activated only when the gain varies, and the gain in the variable gain amplifier 10 is equivalent to the variable gain amplifier 60 according to the comparative example that determines the gain based on only the feedback circuit 62. Consequently, the degradation of sound quality during playback can be prevented.

Thus, in the variable gain amplifier 10 according to the present disclosure, by improving the resolution of level settings of the audio output signal, smoothing mute can be realized, and the generation of the popping noise can be prevented while the sound quality during playback can be kept. Accordingly, quality of the audio device can be improved.

In addition, the circuit configuration and connection of the variable gain amplifier is not limited to the above-described embodiment, and various modifications and improvements in the circuit and connection of the variable gain amplifier are possible without departing from the spirit and scope of the present disclosure. For example, as described above, although the R-2R DAC is used as the attenuator 3, the simple resistance dividing circuit like the feedback circuit 2 shown in FIG. 9 can be adapted to the attenuator 3 to achieve the functions.

Numerous additional modifications and variations are possible in light of the above teachings. It is therefore to be understood that, within the scope of the appended claims, the disclosure of this patent specification may be practiced otherwise than as specifically described herein.

What is claimed is:

1. A variable gain amplifier to adjust gain and level of an output voltage, comprising:
    an input terminal from which an input voltage is input;
    an output terminal to which the output voltage is output;
    an operational amplifier, connected to the output terminal, having an inverting input terminal, a non-inverting input terminal, and an output terminal to output the output voltage;
    an attenuation-rate adjustable feedback circuit, connected to the input terminal, the inverting terminal, and the output terminal of the operational amplifier, to feed back the output voltage from the output terminal of the operational amplifier to the inverting input terminal of the operational amplifier as a feedback voltage, attenuate the output voltage, and output the feedback voltage to the inverting terminal of the operational amplifier; and
    an attenuation-rate adjustable attenuator, connected to the input terminal and the non-inverting terminal of the operational amplifier, to attenuate the input voltage for outputting the voltage as an attenuated voltage to the non-inverting input terminal of the operational amplifier, the attenuator comprising a digital-analog converter,
    wherein settings of the attenuation rates of the feedback circuit and the attenuator are combined to increase a resolution of level of the output voltage.

2. The variable gain amplifier according to claim 1, further comprising a level control circuit to generate and output a digital signal to control the attenuation rates of the respective feedback circuit and the attenuator,
    wherein the feedback circuit comprises a resistance dividing switching type analog adder-subtractor controlled by the digital signal, and the digital-analog converter of the attenuator controlled by the digital signal.

3. A variable gain amplifier to adjust gain and level of an output voltage, comprising:
    an input terminal from which an input voltage is input;
    an output terminal to which the output voltage is output;
    an operational amplifier, connected to the output terminal, having an inverting input terminal, a non-inverting input terminal, and an output terminal to output the output voltage;
    an attenuation-rate adjustable feedback circuit, connected to the input terminal, the inverting terminal, and the output terminal of the operations amplifier, to feed back the output voltage from the output terminal of the operational amplifier to the inverting input terminal of the operational amplifier as a feedback voltage, attenuate the output voltage, and output the feedback voltage to the inverting terminal of the operational amplifier; and
    an attenuation-rate adjustable attenuator, connected to the input terminal and the non-inverting terminal of the operational amplifier, to attenuate the input voltage for outputting the voltage as an attenuated voltage to the non-inverting input terminal of the operational amplifier, wherein setting of the attenuation rates of the feedback circuit and the attenuator are combined to increase a resolution of level of the output voltage, and wherein the attenuator is activated only when the gain varies, and the gain in determined by only the feedback circuit when the gain if fixed.

4. A variable gain amplifier to adjust gain and level of an audio output signal, comprising:

an input terminal from which an audio input signal is input;

an output terminal to which the audio output signal is output;

an operational amplifier, connected to the output terminal, having an inverting input terminal, a non-inverting input terminal, and an output terminal to output the audio output signal;

an attenuation-rate adjustable feedback circuit, connected to the input terminal, the inverting terminal and the output terminal of the operational amplifier, to feed back the audio output signal from the output terminal of the operational amplifier to the inverting input terminal of the operational amplifier as a feedback signal, attenuate the audio output signal, and output the feedback signal to the inverting terminal of the operational amplifier; and an attenuation-rate adjustable attenuator, connected to the input terminal and the non-inverting terminal of the operational amplifier, to attenuate the audio input signal for outputting the signal as an attenuated signal to the non-inverting input terminal of the operational amplifier, the attenuator comprising a digital-analog converter, wherein settings of the attenuation rates of the feedback circuit and the attenuator are combined and a resolution of level of the audio output signal is increased.

5. The variable gain amplifier according to claim 4, further comprising a level control circuit to generate and output a digital signal to control the attenuation rates of the respective feedback circuit and the attenuator, wherein the feedback circuit comprises a resistance dividing switching type analog adder-subtractor controlled by the digital signal, and the digital-analog converter of the attenuator is controlled by the digital signal.

6. A variable gain amplifier to adjust gain and level of an audio output signal, comprising:

an input terminal from which an audio input signal is input;

an output terminal to which the audio output signal is output;

an operational amplifier, connected to the output terminal, having an inverting input terminal, a non-inverting terminal, and an output terminal to output the audio output signal;

an attenuation-rate adjustable feedback circuit, connected to the input terminal, the inverting terminal and the output terminal of the operational amplifier, to feed back the audio output signal from the output terminal of the operational amplifier to the inverting input terminal of the operational amplifier as a feedback signal, attenuate the audio output signal, and output the feedback signal to the inverting terminal of the operational amplifier; and an attenuation-rate adjustable attenuator, connected to the input terminal and the non-inverting terminal of the operational amplifier, to attenuate the audio input signal for outputting the signal as an attenuated signal to the non-inverting input terminal of the operational amplifier, wherein setting of the attenuation rates of the feedback circuit and the attenuator are combined and a resolution of level of the audio output signal is increased, and wherein the attenuator is activated only when the grain varies, and the grain is determined by only the feedback circuit when the gain is fixed.

7. An audio device comprising:

a digital signal processor to do digital signal processing; and a variable gain amplifier to adjust gain and level of an audio output signal, the variable gain amplifier comprising:

an input terminal from which an audio input signal is input;

an output terminal to which the audio output signal is output;

an operational amplifier, connected to the output terminal, having an inverting input terminal, a non-inverting input terminal, and an output terminal to output the audio output signal is output;

an attenuation-rate adjustable feedback circuit, connected to the input terminal, the inverting terminal and the output terminal of the operational amplifier, to feed back the audio output signal from the output terminal of the operational amplifier to the inverting input terminal of the operational amplifier as a feedback signal, attenuate the audio output signal, and output the feedback signal to the inverting terminal of the operational amplifier; and an attenuation-rate adjustable attenuator, connected to the input terminal and the non-inverting terminal of the operational amplifier, to attenuate the audio input signal for outputting the signal as an attenuated signal to the non-inverting input terminal of the operational amplifier, the attenuator comprising a digital-analog converter, wherein settings of the attenuation rates of the feedback circuit and the attenuator are combined to increase a resolution of level of the audio output signal.

8. The audio device according to claim 7, further comprises a level control circuit to generate and output digital signals to control the attenuation rates of the respective feedback circuit and the attenuator, wherein the feedback circuit comprises a resistance dividing switching type analog adder-subtractor controlled by the digital signal, and the digital-analog converter of the attenuator is controlled by the digital signal.

9. An audio device comprising:

a digital signal processor to do digital signal processing; and a variable gain amplifier to adjust gain and level of an audio output signal, the variable gain amplifier comprising:

an input terminal from which an audio input signal is input;

an output terminal to which the audio output signal is output;

an operational amplifier, connected to the output terminal, having an inverting input terminal, a non-inverting input terminal, and an output terminal to output the audio output signal is output;

an attenuation-rate adjustable feedback circuit, connected to the input terminal, the inverting terminal and the output terminal of the operational amplifier, to feed back the audio output signal from the output terminal of the operational amplifier to the inverting input terminal of the operational amplifier as a feedback signal, attenuate the audio output signal, and output the feedback signal to the inverting terminal of the operational amplifier; and an attenuation-rate adjustable attenuator, connected to the input terminal and the non-inverting terminal of the operational amplifier, to attenuate the audio input signal for outputting the signal as an attenuated signal to the non-inverting input terminal of the operational amplifier, wherein setting of the attenuation rates of the feedback circuit and the attenuator are combined to increase a resolution of level of the audio output signal, and wherein the attenuator is activated only when volume of the audio signal is adjusted, and the gain is determined by only the feedback circuit when the audio device is in normal play back.

* * * * *